US007231615B2

(12) United States Patent
Vandling (10) Patent No.: US 7,231,615 B2
(45) Date of Patent: Jun. 12, 2007

(54) METHODS AND APPARATUS FOR TRANSFORMING SEQUENTIAL LOGIC DESIGNS INTO EQUIVALENT COMBINATIONAL LOGIC

(75) Inventor: Gilbert C. Vandling, Endicott, NY (US)

(73) Assignee: Cadence Design Systems, Inc., San Jose, CA (US)

( * ) Notice: Subject to any disclaimer, the term of this patent is extended or adjusted under 35 U.S.C. 154(b) by 77 days.

(21) Appl. No.: 10/731,566

(22) Filed: Dec. 8, 2003

(65) Prior Publication Data

US 2005/0125753 A1 Jun. 9, 2005

(51) Int. Cl.
*G06F 17/50* (2006.01)

(52) U.S. Cl. .............................................. 716/3; 716/5

(58) Field of Classification Search .................... 716/1, 716/3–5; 703/14–17; 714/26, 724, 744
See application file for complete search history.

(56) References Cited

U.S. PATENT DOCUMENTS

| 5,590,135 | A | | 12/1996 | Abramovici et al. | |
|---|---|---|---|---|---|
| 5,592,655 | A | * | 1/1997 | Takamine et al. ............. | 703/16 |
| 5,625,630 | A | | 4/1997 | Abramovici et al. | |
| 5,878,055 | A | * | 3/1999 | Allen ......................... | 714/744 |
| 6,530,063 | B1 | * | 3/2003 | Andreev et al. ................ | 716/3 |
| 6,560,758 | B1 | * | 5/2003 | Jain ............................... | 716/7 |
| 6,564,358 | B2 | * | 5/2003 | Moondanos et al. ........... | 716/5 |
| 6,665,844 | B1 | * | 12/2003 | Stanion .......................... | 716/5 |
| 6,883,115 | B2 | * | 4/2005 | Sanada ......................... | 714/26 |
| 6,885,983 | B1 | * | 4/2005 | Ho et al. ....................... | 703/14 |
| 6,957,403 | B2 | * | 10/2005 | Wang et al. ................... | 716/3 |
| 2002/0112209 | A1 | | 8/2002 | Abramovici et al. | |
| 2003/0154433 | A1 | * | 8/2003 | Wang et al. ................ | 714/726 |

OTHER PUBLICATIONS

Girard et al., "A Trace-Based Method for Delay Fault Diagnosis in Synchronous Sequential Circuits," IEEE, 1995, pp. 526-532.*
Ranjan et al., "Using Combinational Verification for Sequential Circuits," IEEE, Jan. 1999, pp. 1-7.*
Kelsey, Todd; An efficient algorithm for sequential circuit test generation; IEEE Transactions on Computers; 42(1993) Nov., No. 11, New York.
Schulz, Michael & Auth, Elisabeth; Essential: An efficient self-learning test pattern generation algorithm for sequential circuits; 1989 International Test Conference; Institute of Computer Aided Design, Department of Electrical Engineering Technical University of Munich, D-8000 Munich 2, West Germany.
Melvin A. Breuer, Arthur D. Friedman, Diagnosis & Reliable Design Of Digital Systems, Chapters 2 and 3, pp. 25-173, 1976.

\* cited by examiner

*Primary Examiner*—Vuthe Siek
(74) *Attorney, Agent, or Firm*—Orion Law Group, PLC; William E. Alford; Ramin Aghevi (57) ABSTRACT

Disclosed are novel methods and apparatus for transforming sequential logic designs into equivalent combinational logic. In an embodiment of the present invention, a design method for transforming sequential logic designs into equivalent combinational logic is disclosed. The design method includes: simulating each stage of a clocking sequence to produce simulation values; saving the simulation values; and performing a plurality of backward logic traces based on the saved simulation values to provide an equivalent combinational logic representation of a sequential logic design.

34 Claims, 7 Drawing Sheets

METHODS AND APPARATUS FOR TRANSFORMING SEQUENTIAL LOGIC DESIGNS INTO EQUIVALENT COMBINATIONAL LOGIC

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. The following notice applies to the software and data as described below and in the drawings hereto: Copyright © 2003, Cadence Design Systems, Inc., All Rights Reserved.

FIELD OF INVENTION

The subject of this application relates generally to the field of integrated circuit (IC) design tools. In an embodiment of the present invention, a method is disclosed for transforming sequential logic designs into equivalent combinational logic.

BACKGROUND OF INVENTION

As IC fabrication technology improves, manufacturers are able to integrate additional functionality onto a single silicon substrate. As the number of these functions increases, however, so does the complexity of the designs. Due to this complexity, computers are commonly utilized to increase the efficiency and the speed of the design process. As circuit designs grow in complexity, it is imperative to decrease the number of computer resources and hours spent on these designs. Especially, in the current climate of competition, it is of utmost importance that designers have access to design tools that can streamline and speed up the IC design process.

One design tool available for testing random logic utilizes automatic test pattern generation (ATPG). In ATPG, deterministic test patterns are pre-generated using a gate-level representation of the design netlist. The netlist defines the entire IC design including all components and interconnections. The pre-generated patterns are then stored in a memory and scanned into the circuit. After applying one or more functional clock cycles, the data is scanned out to capture the response data.

The development of ATPG algorithms has traditionally focused on testing combinational logic (i.e., logic with no internal memory states). While the problem of combinational ATPG is classified as NP complete (meaning that no complete solution can be reached in a reasonable amount of computer time/memory), various algorithms and heuristics have been developed that provide partial solutions. In general, the ATPG problem is kept combinational by placing specific requirements on any latches contained in the design. The prevailing practice is to require that the latches be connected into one or more shift registers that allow the latches to be both directly controlled and directly observed (such as techniques related to level sensitive scan design (LSSD) and other scan-based techniques).

Sequential ATPG, however, poses a significantly more difficult problem than combinational ATPG. In particular, the internal memory states of a logic design add another dimension to the ATPG problem search space. While combinational ATPG needs to consider a staggering number of logical possibilities, sequential ATPG has to consider an ordered sequence of logical possibilities. In fact, most LSSD and other scan-based techniques were developed in order to avoid having to solve sequential ATPG problems when testing large, complex logic designs.

Generally, the prior solutions assume a single, ungated clock. They are not suitable for use in designs with more than one clock, nor in designs where the clocks are gated (wherein a clock pulse at the design's input may or may not reach the latches being considered). The prior art also fails to address clock race conditions (wherein one latch supplies data to a second latch and both are controlled by the same clock) and poorly controlled clocking (wherein a latch's clocks are not directly controlled by the clock inputs to the design).

More specifically, one approach is to consider sequential circuits as if they were combinational. However, this is done only for purposes of identifying untestable (redundant) faults and this approach may be merely valid for simple clocking (i.e., single clock, no clock gating nor clock races). In another approach, sequential designs are treated as if they were combinational for purposes of test generation. However, this approach is applicable only to specific circuit topologies (e.g., the sequential design must be acyclic, the sequential depths of the logic paths must be balanced or internally balanced), and the clocking must be simple (i.e., single clock, no clock gating nor clock races).

A further approach discards latches (stripping them of their controllability and/or observability) that would interfere with maintaining a combinational approach to a somewhat sequential design. This approach also does not provide a solution for proceeding through a latch that has been clocked and would be unsuitable for situations where the same clock(s) are pulsed repeatedly or if there is a large sequential depth, in part, because all latches would quickly be discarded in such cases.

SUMMARY OF INVENTION

The present invention, which may be implemented on a general-purpose digital computer, includes novel methods and apparatus to transform sequential logic designs into equivalent combinational logic.

In an embodiment of the present invention, a design method for transforming sequential logic designs into equivalent combinational logic is disclosed. The design method includes: simulating each stage of a clocking sequence to produce simulation values; saving the simulation values; and performing a plurality of backward logic traces based on the saved simulation values to provide an equivalent combinational logic representation of a sequential logic design.

In one embodiment of the present invention, a back tracing design method for transforming sequential logic designs into equivalent combinational logic is disclosed. The method includes: determining whether a time T is negative; if it is determined that the time T is negative, producing a block B at time T as a block tied to an unknown logic; if it is determined that the time T is not negative, determining whether the block B has a known simulation value at time T; and if it is determined that the block B has a known simulation value at time T, producing a tied block B at time T with the known simulation value.

BRIEF DESCRIPTION OF DRAWINGS

The present invention may be better understood and it's numerous objects, features, and advantages made apparent to those skilled in the art by reference to the accompanying drawings in which.

The use of the same reference symbols in different drawings indicates similar or identical items.

DETAILED DESCRIPTION

In the following description, numerous details are set forth. It will be apparent, however, to one skilled in the art, that the present invention may be practiced without these specific details. In other instances, well-known structures and devices are shown in block diagram form, rather than in detail, in order to avoid obscuring the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1:
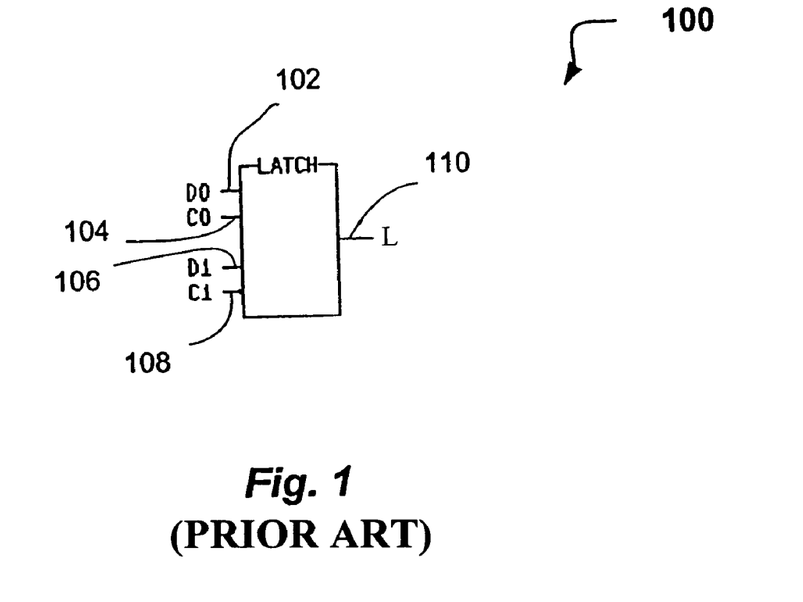
FIG. 1 illustrates an exemplary multi-port latch 100 in accordance with the prior art.

FIG. 1 illustrates an exemplary multi-port latch 100 in accordance with the prior art. The two port latch 100 has a data input "D0" (102) and a clock input "C0" (104) as its first port while a data input "D1" (106) and a clock input "C1" (108) feed the second port. If clock input "C0" is on, the latch 100 takes on the value of data input "D0" at its output L (110). Likewise, if clock input "C1" is on, the latch takes on the value of data input "D1" at the output L (110). If neither clock is on, the latch retains its previous value at the output L (110).

Figure 2:
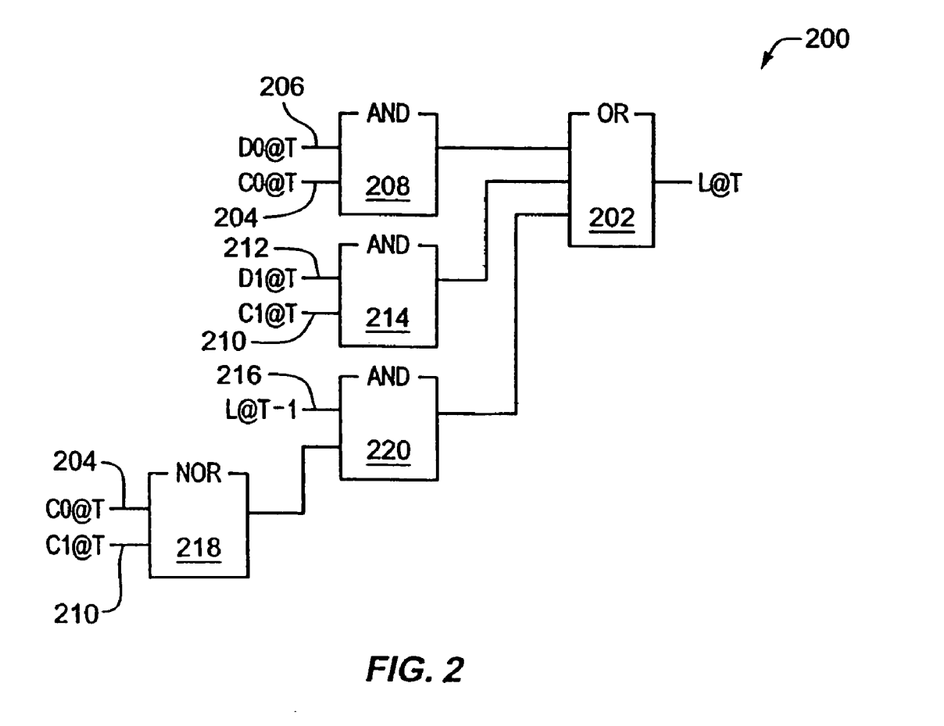
FIG. 2 illustrates an exemplary combinational model 200 for the latch 100 of FIG. 1 at time "T" in accordance with an embodiment of the present invention.

FIG. 2 illustrates an exemplary combinational model 200 for the latch 100 of FIG. 1 at time "T" in accordance with an embodiment of the present invention. The combinational model 200 uses a multiplexer (MUX) constructed with AND/OR gates to model the behavior of the two latch ports and to model the memory state of the latch 100. The output of the OR block 202 represents the output of the latch (designated as "L") at some particular time (designated as "T"). It can be seen that if the clock input "C0" 204 is on (at time "T"), the value of data input "D0" 206 (again, at time "T") is passed to the output of AND gate 208. Likewise, clock input "C1" 210 (at time "T") would pass the data input "D1" 212 (at time "T") to the output of the AND gate 214. If neither clock input "C0" 204 nor "C1" 210 are on at time "T", the output of the OR gate 202 is controlled by the latch's value in the immediately prior time 216 (i.e., "T−1"), for example, through the combination of the NOR gate 218 and an AND gate 220. This model may give an incorrect result if both clocks "C0" 204 and "C1" 210 are on at time "T" and the data inputs "D0" 206 and "D1" 212 differ (again, at time "T"). This can be addressed by avoiding the multiple clock case through adherence to design-for-test (DFT) ground rules, constraining the logic, or through use of a three-state model such as shown in FIG. 3.

Figure 3:
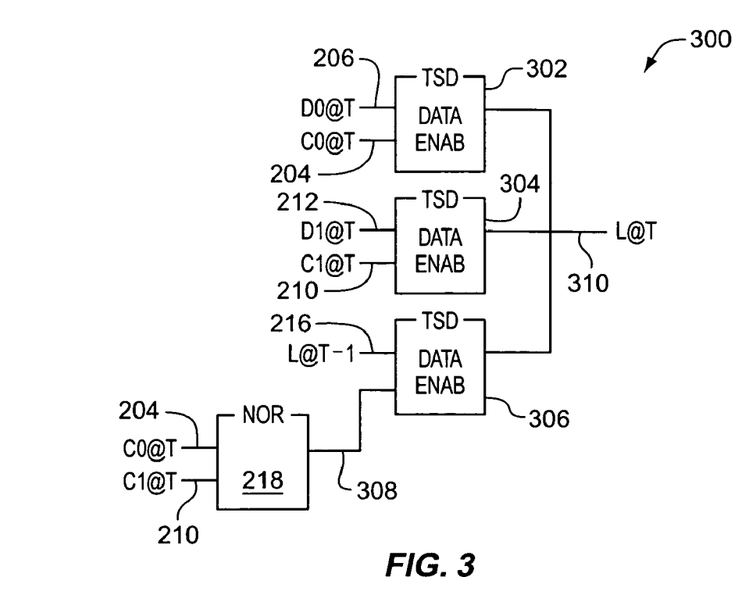
FIG. 3 illustrates an exemplary tri-state MUX model 300 for the latch 100 of FIG. 1 at time "T" in accordance with an embodiment of the present invention.

FIG. 3 illustrates an exemplary tri-state MUX model 300 for the latch 100 of FIG. 1 at time "T" in accordance with an embodiment of the present invention. The model 300 replaces the combination of the AND gates (208, 214, and 220) and the OR gate 202 with three tri-state drivers 302, 304, and 306 (TSDs). As a result, if more than one clock input to the latch (100) is on at time "T," more than one TSD enable input will be on in the TSD model (300). If the corresponding data input values conflict, this tri-state model will produce three-state contention. The contention may be avoided, i.e., multiple clocks admitting conflicting data values, for example, through use of the ATPG algorithm's contention prevention process(es). Accordingly, this solution is envisioned to allow individual TSDs to drive the output 310. In accordance with an embodiment of the present invention, it is envisioned that adherence to DFT ground rules will avoid contention (i.e., having the output of two or more of the TSDs drive the output 310) which may be destructive at silicon level.

Figure 4:
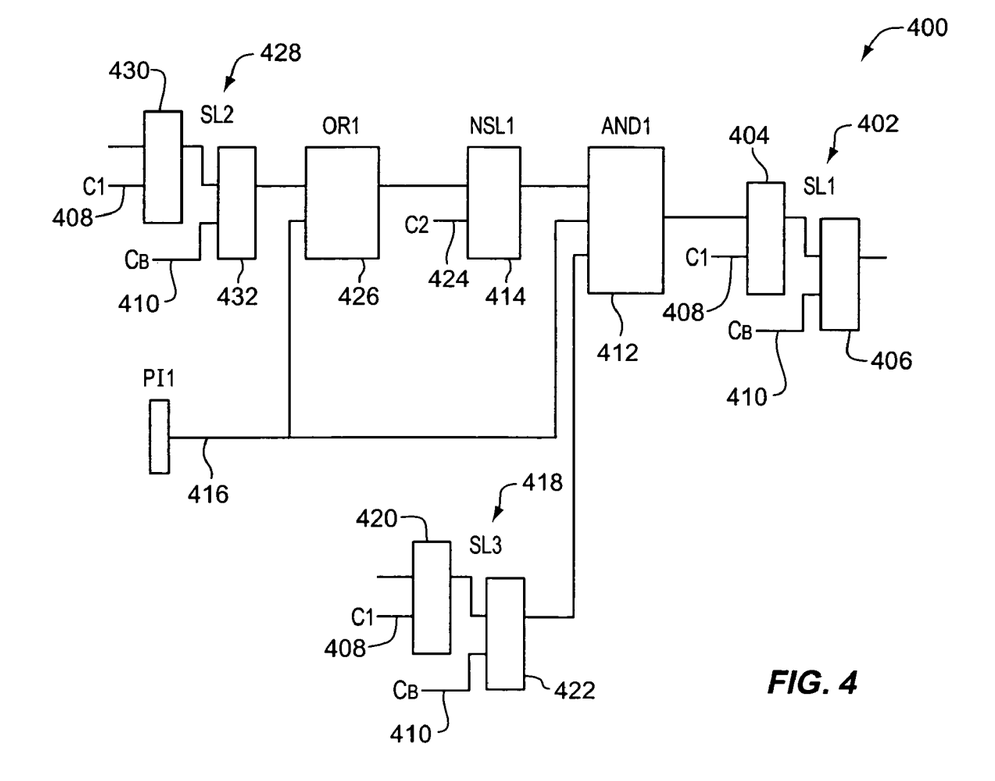
FIG. 4 illustrates an exemplary sequential circuit 400.

FIG. 4 illustrates an exemplary sequential circuit 400. The circuit 400 includes a latch "SL1" 402 (which is a master/slave pair, including master latch 404 and slave latch 406). The latch "SL1" 402 is assumed to be scannable (i.e., connected to a shift register in order to provide controllability and observability). The master latch 404 is clocked by clock input "C1" 408 (the scan port is not shown in order to simplify the example). The slave latch 406 is clocked by clock input "$C_B$" 410. The data input to latch "SL1" 402 is fed by a three-way AND gate "AND1" (412). This AND gate 412 is fed by non-scannable latch "NSL1" (414), primary input "PI1" (416), and a scannable latch "SL3" (418), which is a master/slave pair including a master latch 420 clocked by "C1" (408) and a slave latch 422 clocked by "$C_B$" 410. The latch "NSL1" (414) is clocked by clock input "C2" (424). The data input to "NSL1" is fed by a two-way OR gate "OR1" (426). This OR gate (426) is fed by a scannable latch "SL2" (428) and the primary input "PI1" (416). Latch "SL2" (428) is comprised of a master latch (430) clocked by "C1" (408) and slave latch (432) clocked by "$C_B$" (410).

In one embodiment of the present invention, clocking sequence for the circuit 400 of FIG. 4 consists of the following seven states:

0: SCAN LOAD
1: DRIVE PIs
2: PULSE C2
3: SCAN LOAD

4: DRIVE PIs
5: PULSE C1
6: SCAN UNLOAD

Accordingly, the clocking sequence for FIG. 4 provides a scan load at time "0". This denotes operation of the shift registers in order to place arbitrary values in the scannable latches. For example, this allows latches "SL1" (402), "SL2" (428), and "SL3" (418) to be set (i.e., controlled) to any desired value. The next step (1) in the clocking sequence is to drive the primary inputs at time "1". This is when the physical tester is allowed to drive arbitrary values into the design's primary inputs ("PI1" (416) in this example). The next step (2) is to pulse clock input "C2" (424) at time "2". In this example, pulsing clock input "C2" (424) will capture the output of OR gate "OR1" (426) in the non-scannable latch "NSL1" (414). The scan load operation at time "3" places new values in the scannable latches "SL1" (402), "SL2" (428), and "SL3" (418). (In this example, it is assumed that the scan operation does not disturb the value held in non-scannable latch "NSL1" (414)).

In one embodiment of the present invention, in accordance with the clocking sequence, the tester may drive an arbitrary value into primary input "PI1" (416) at time "4". At time "5" clock input "C1" (408) is pulsed. In this example, the output of gate "AND1" (412) may be captured in the master latch of "SL1" (404). The masters of scannable latches "SL2" (430) and "SL3" (420) may also capture new values. It is envisioned that these new values will have no affect on "SL1" (402). At time "6" the shift registers are operated in order to measure the values held in (the master latches of the scannable latches (e.g., 404, 420, and/or 430). In this example, only the value held in scannable latch "SL1" (402) at the end of the clocking sequence is considered.

For the example illustrated in FIG. 4, it is assumed that all of the clock inputs to all of the latches are off except for when the appropriate clock is being pulsed (also referred to as "well-controlled" clocking). This is a basic ground rule for scan based testing although it may not be always followed. Thus, clock input "C2" (424) to non-scannable latch "NSL1" (414) can only turn on at time "2". Likewise, the clock input "C1" (408) to the scannable latches "SL1" (402), "SL2" (428), and "SL3" (418) may only turn on at time "5". In an embodiment of the present invention, while the techniques discussed herein do work with poorly controlled clocking, the example of FIG. 4 is kept simpler by assuming well-controlled clocks.

Furthermore, the exemplary sequential circuit (400) and the sample clocking sequence are merely intended to be illustrative rather than restrictive. For example, a different circuit may be utilized with a different clocking sequence. Accordingly, it will be apparent to those with ordinary skill in the art that modifications may be made to the described embodiments, with the attainment of all or some of the advantages.

Figure 5:
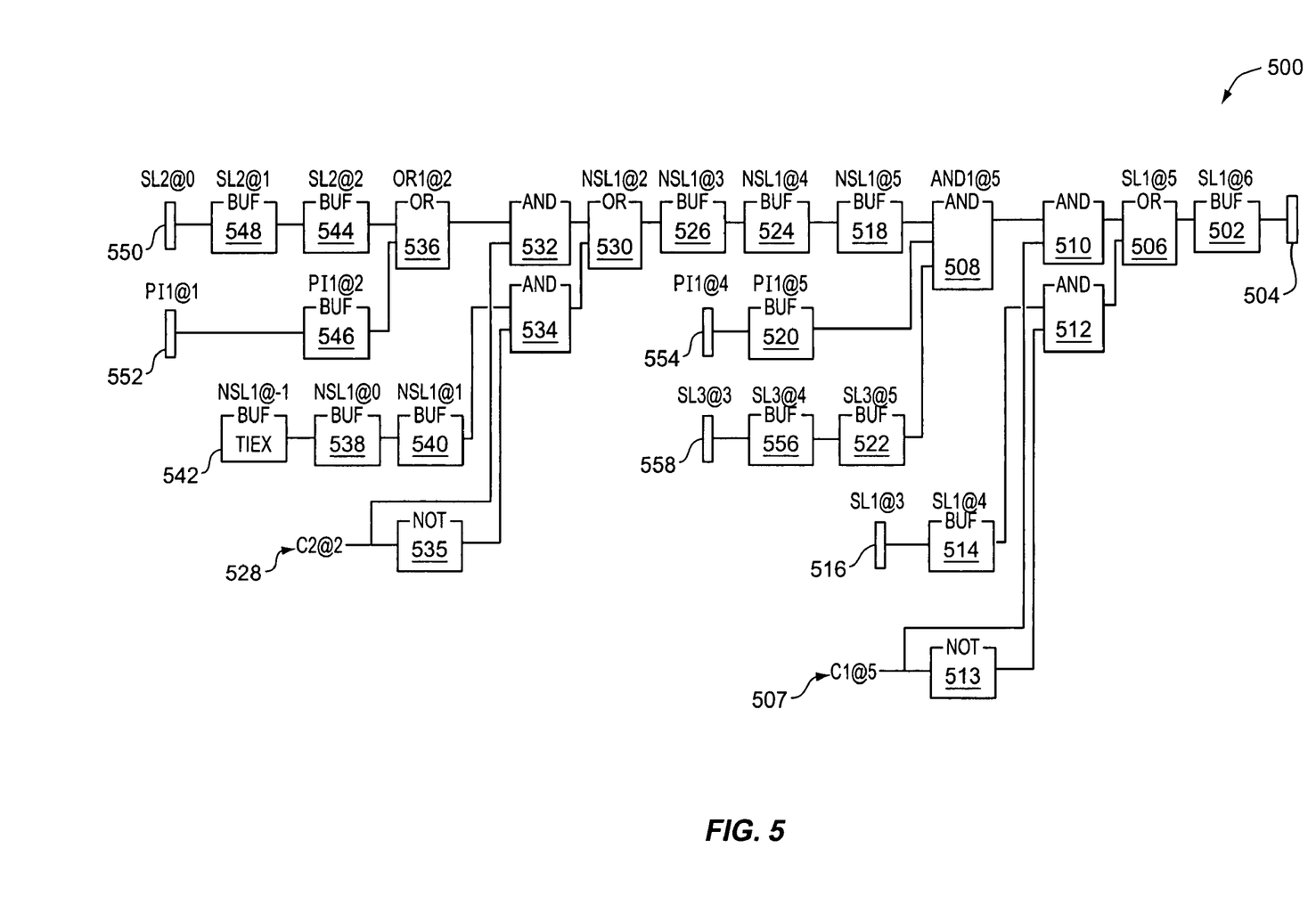
FIG. 5 illustrates an exemplary combinational equivalent 500 for the sequential circuit 400 and the clocking sequence discussed with reference to FIG. 4 in accordance with an embodiment of the present invention.

FIG. 5 illustrates an exemplary combinational equivalent 500 for the sequential circuit 400 and the clocking sequence discussed with reference to FIG. 4 in accordance with an embodiment of the present invention. In one embodiment of the present invention, this combinational equivalent 500 model can be used to predict the value held (or observed by the scan operation) in "SL1" at the end of the clocking sequence (i.e., time "6"). This model does not address the values held in scannable latches "SL2" or SL3".

Accordingly, the scan unload operation at time "6" is used to observe the value in the master latch of "SL1" (404). This observability is denoted by attaching the model for "SL1" at time "6" (designated as "SL1@6" (502) in FIG. 5) to a primary output (504). It is envisioned that any scan style (e.g., level sensitive, edge triggered, etc.) may be used to provide the controllability and observability for the scannable latches. Since the clock input "C1" (408) to latch "SL1" (402) is off at the start of the scan operation, latch "SL1" (402) retains its value from the immediately prior time (i.e., time "5"). The model for scannable latch "SL1" at time "6" is a buffer fed by the model for this same latch at time "5" (designated as "SL1@5" (506) in the diagram) in an embodiment of the present invention. In this embodiment, the value of latch "SL1" at time "6" is the same as its value at time "5".

Referring back to FIG. 4, the pulse on clock input "C1" at time "5" (507) allows latch "SL1" (402) to change its value. If the clock input "C1" to latch "SL1" is on at time "5", the output of gate "AND1" at time "5" (508) will be passed through the AND/OR MUX representing latch "SL1" at time "5" (designated as "SL1@5" (506) which may include the two AND gates 510 and 512 in FIG. 5). If this clock input is off, latch "SL1" retains it value from the immediately prior time (namely, time "4") through a NOT gate 513 which negates the clock input (507) as an input to the AND gate 512.

The model for scannable latch "SL1" at time "4" (designated as "SL1@4" (514) in FIG. 5) may be a buffer. Since all clock inputs are off while the primary inputs are being driven (e.g., set to potentially new values by the tester), the latch retains its value from the immediately prior time (i.e., time "3"). At time "3", the scan load operation is used to place arbitrary values in the scannable latches (including "SL1" (402)). In one embodiment of the present invention, the direct controllability of scannable latches allows them to be represented as primary inputs when scan load operations are applied. This is denoted by the model for latch "SL1" at time "3" (designated as "SL1@3" (516) in the diagram) appearing as a primary input.

The output of gate "AND1" at time "5" (508) is the Boolean AND of that gate's inputs, all at time "5". Thus, appropriate models for latch "NSL1" (518), primary input "PI1" (520), and scannable latch "SL3" (522) (all at time "5") are connected to "AND1@5" (508) (e.g., the model for gate "AND1" at time "5"). In one embodiment of the present invention, since the value of non-scannable latch "NSL1" (414) can not change in times "5", "4", nor "3", the models for latch "NSL1" at times "5", "4", and "3" (designated as "NSL1@5" (518), "NSL1@4" (524), and "NSL1@3" (526), respectively in FIG. 5) are buffers. In an embodiment of the present invention, these buffers illustrate that in each of these three times, the value of "NSL1" is unchanged from the immediately prior time.

When clock input "C2" is pulsed at time "2" (528), the latch "NSL1" may change its value. The model for non-scannable latch "NSL1" at time "2" (designated as "NSL1@2" (530) which may include the two AND gates 532 and 534 in FIG. 5) may use an AND/OR MUX to show that if the clock input "C2" to latch "NSL1" is on at time "2", the latch takes on the value of gate "OR1" at time "2" (536). If this clock input (528) is off, the latch "NSL1" retains it value from the immediately prior time (i.e., time "1") through a NOT gate 535 which negates the clock input (528) as an input to the AND gate 534. Since the latch "NSL1" is not changing its value at times "1" and "0", buffers (540 and 538, respectively) are used to show that latch "NSL1" retains its value from the prior time(s). When time "−1" is reached (i.e., prior to the start of the clocking sequence), an unknown value (tied to logic X) is used to reflect the fact that the initial state of "NSL1" is unknown (designated as "NSL1@-1" (542) in FIG. 5).

The output of gate "OR1" at time "2" is the Boolean OR of its inputs, both at time "2". Thus, models for latch "SL2" and primary input "PI1" (both at time "2") are connected to "OR1@2" (536) (designated as "SL2@2" (544) and "PI1@2" (546), respectively in FIG. 5). In accordance with an embodiment of the present invention, at times "2" and "1", scannable latch "SL2" does not change its value. Thus, buffers may be used to show that the latch retains its value from the previous time(s) (models designated as "SL2@2" (544) and "SL2@1" (548) in FIG. 5). At time "0", the scan load operation places an arbitrary value in latch "SL2". This is represented by creating a primary input for scannable latch "SL2" at time "0" (designated as "SL2@0" (550) in FIG. 5).

In one embodiment of the present invention, the model for primary input "PI1" at time "2" (546) is a buffer. It is a fundamental assumption of scan-based testing that the values driven into the primary inputs by the tester do not change during a clock pulse. The buffer shows that the value on primary input "PI1" does not change during the clock pulse at time "2". At time "1", the primary inputs are driven to arbitrary values by the tester. This is shown by creating a primary input to represent "PI1" at time "1" (552) (designated at "PI1@1" in the diagram). In a similar fashion, the model for primary input "PI1" at time "5" (designated as "PI1@5" (520) in FIG. 5) may also be a buffer and a primary input is created for "PI1" at time "4" (designated as "PI1@4" (554) in FIG. 5).

The models for scannable latch "SL3" at times "5" and "4" may also be buffers (designated as "SL3@5" (522) and "SL3@4" (556), respectively). This is because the value of (the slave latch of) scannable latch "SL3" may not change during these times. The direct controllability of scannable latch "SL3" during the scan load operation at time "3" allows this latch to be modeled as a primary input (designated as "SL3@3" (558) in FIG. 5).

Figure 6A:
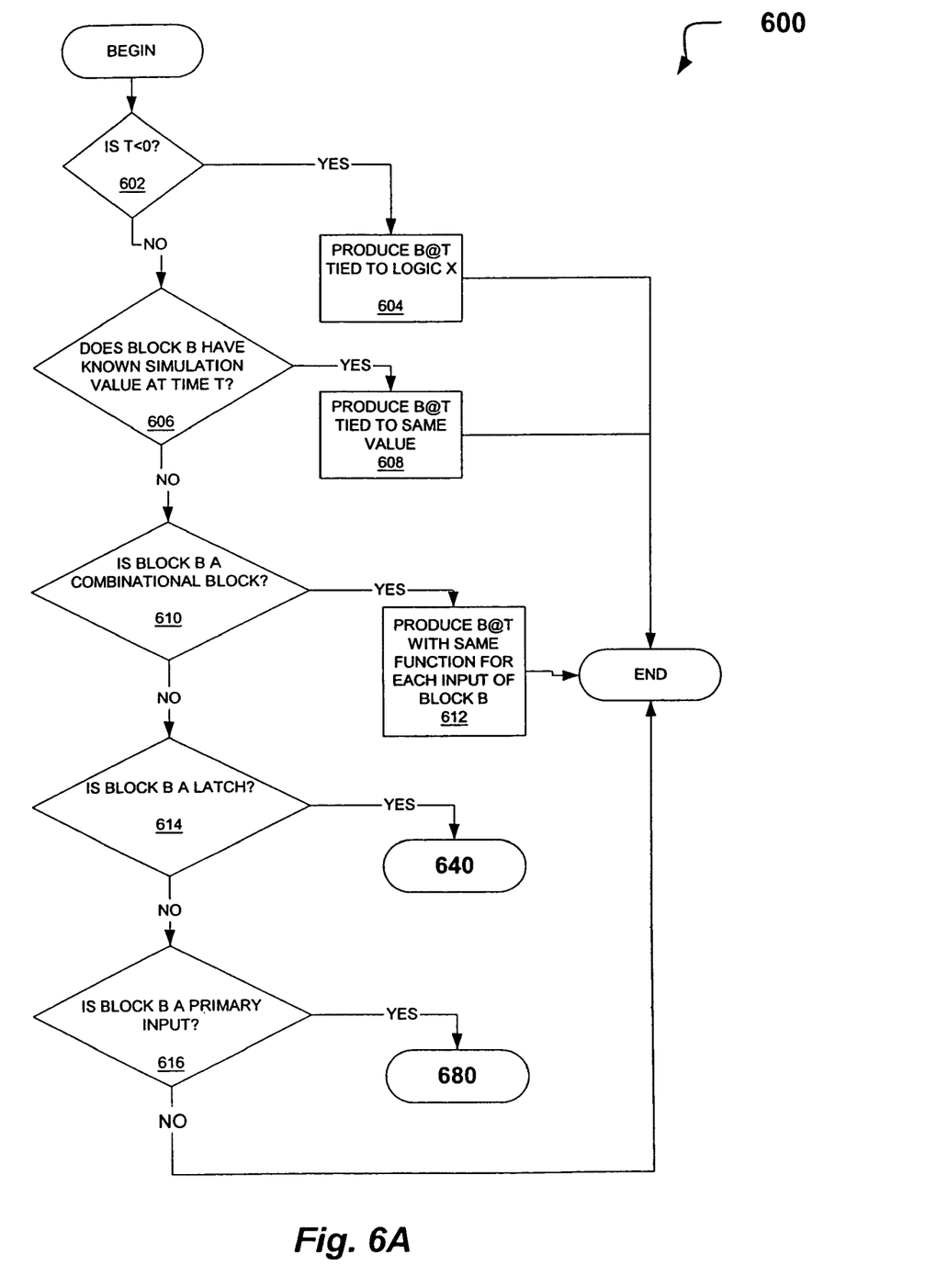
FIG. 6A illustrates an exemplary flow diagram of a method 600 for transforming a sequential logic design into combinational logic in accordance with an embodiment of the present invention.

FIG. 6A illustrates an exemplary flow diagram of a method 600 for transforming a sequential logic design into combinational logic in accordance with an embodiment of the present invention. In one embodiment of the present invention, the method 600 takes as input a given sequential logic design and a given clocking sequence. The method 600 then produces as output a combinational logic design that is logically equivalent to the original, sequential design under the influence of the given clocking sequence.

It is envisioned that the sequential logic design may be a collection of logical (Boolean) primitives (including but not limited to AND, OR, NOT, etc) and/or memory elements (including but not limited to latch primitives and memory arrays). In an embodiment of the present invention, memory arrays (e.g., random access memories (RAMs), read-only memories (ROMs), and the like) may be modeled using an array of (non-scannable) latches if the method is to be used on designs containing memory arrays. For example, it is envisioned that providing non-scannable latches for one or two of the RAM's addresses may be sufficient in order to allow effective testing.

The method 600 starts in a stage 602 which determines whether time T is less than 0. If the stage 602 determines that T is less than 0, a stage 604 produces block B at time T (B@T) as a block tied to logic X. This is in part because no values are known before the start of the clocking sequence. The clocking sequence is assumed to be an ordered series of steps including but not limited to scan operations (loads and unloads), primary input (PI) force events (where the tester drive the design's primary inputs), clock pulses, and measure events (measuring the design's primary outputs or scannable latches). After the stage 604, the method 600 terminates.

If the stage 604 determines that T is not less than 0, the method 600 continues with a stage 606, which determines whether the block B has a known simulation value at time T. If it does, a stage 608 produces a tied block B@T tied to the same, known value (e.g., 0, 1, or Z (high impedance)). After the stage 608, the method 600 terminates.

If the stage 606 determines that the block B does not have any known simulation values at time T, a stage 610 determines whether the block B is a combinational block (e.g., AND, OR, etc.). If it is, a stage 612 produces block B@T with the same function as block B. Each input (I) of block B is modeled using the process (600) and each of these models is connected to B@T. After the stage 612, the method 600 terminates.

Alternatively, if the stage 610 determines that block B is not combinational, a stage 614 determines whether the block B is a latch. If so, the method continues with a stage 640 further discussed below. If the stage determines that the block B is not a latch, a stage 616 determines whether the block B is a primary input. If so, the method 600 continues with a stage 680 (further discussed below). Otherwise, the method 600 terminates after the stage 616 if it is determined that the block B is not a primary input.

Figure 6B:
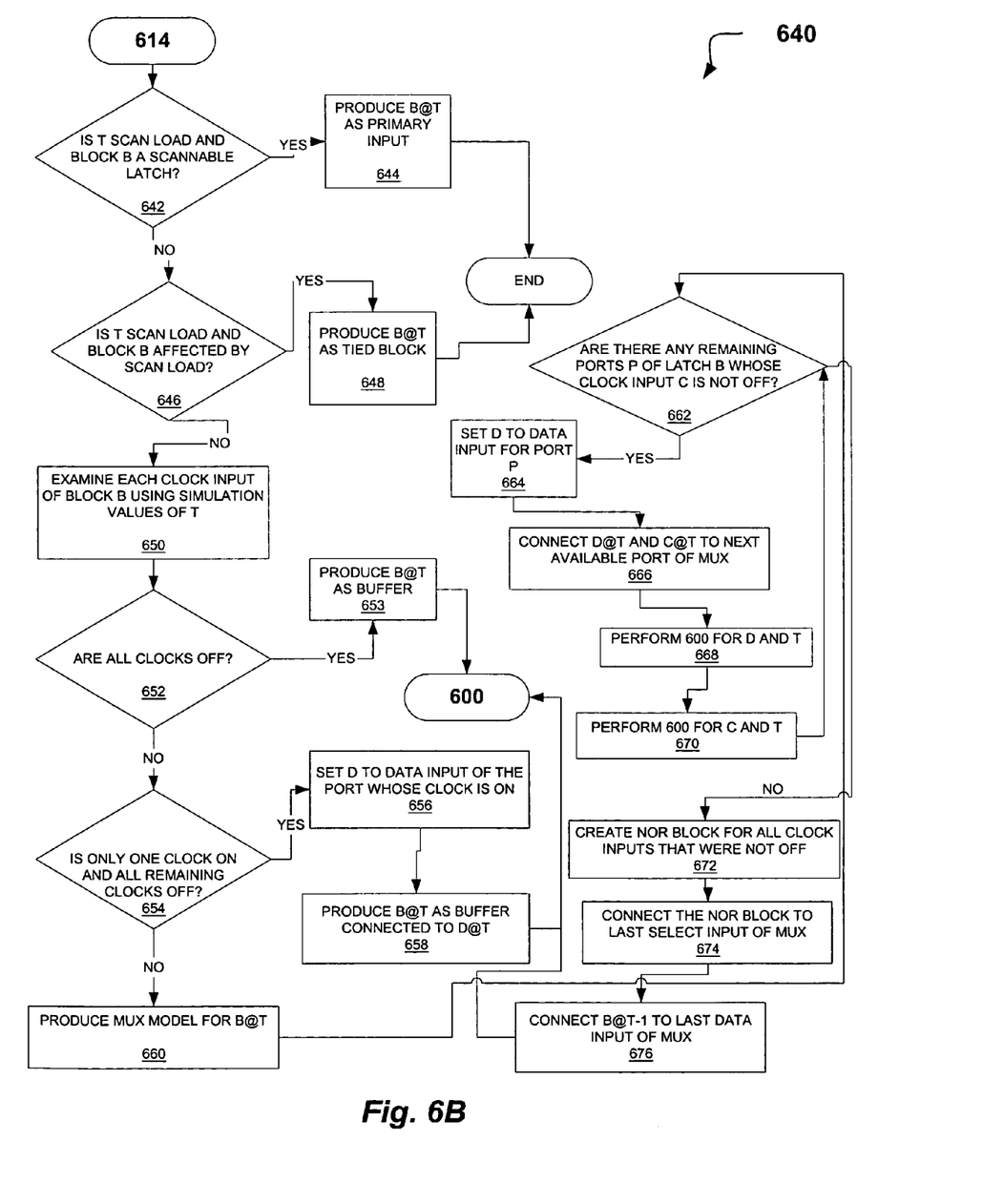
FIG. 6B illustrates an exemplary flow diagram of a method 640 invoked by the stage 614 of FIG. 6A in accordance with an embodiment of the present invention.

FIG. 6B illustrates an exemplary flow diagram of a method 640 invoked by the stage 614 of FIG. 6A in accordance with an embodiment of the present invention. The method 640 starts with a stage 642, which determines if T is a scan load and block B is a scannable latch. If so, a stage 644 produces B@T as a primary input (PI) and the method 640 terminates thereafter. Otherwise, a stage 646 determines if T is a scan load and block B is affected by the scan load. If so, a stage 648 produces B@T as a tied block (e.g., tied to 0, 1, or X depending on the effect of the scan load on block B) and the method 640 terminates thereafter. Otherwise, a stage 650 examines each of the clock inputs of block B using, for example, the simulation values from time T (e.g., count the number of clock inputs definitely on, definitely off and the number of clock inputs at an unknown value).

The method 640 then continues with a stage 652, which determines if all clocks are definitely off. If so, a stage 653 produces B@T as a buffer connected to B@T−1. Thereafter, the method 600 is invoked with block B and time T−1. If the stage determines that all clocks are not definitely off, a stage 654 determines if exactly one clock is definitely on with the remaining clocks definitely off. If so, D is set to data input of the port whose clock is on (656). A stage 658 then produces B@T as a buffer connected to D@T and the method 600 is invoked for D and time T.

If the stage 654 returns "no," the method 640 continues with a stage 660 which produces a MUX model for B@T. The MUX may have one port for each clock input to B that was not definitely off at time T plus an additional port for the latch's prior state. Then, for each port P of latch B whose clock input C is not definitely off (662), D is set to the data input for port P (664), DUT and C@T are connected to the next available port of the MUX (666) (e.g., as data and select, respectively), the method 600 is invoked for D and T (668), and the method 600 is invoked for C and T (670).

Once the stage 662 returns a "no," a stage 672 creates a NOR block to combine all of the clock inputs to block B at time T that were determined not to definitely be off. A stage 674 connects the NOR block to the last select input of the MUX. Then, B@T−1 is connected to the last data input of the MUX (676). And, the method 640 continues by invoking the method 600 with block B and time T−1.

Figure 6C:
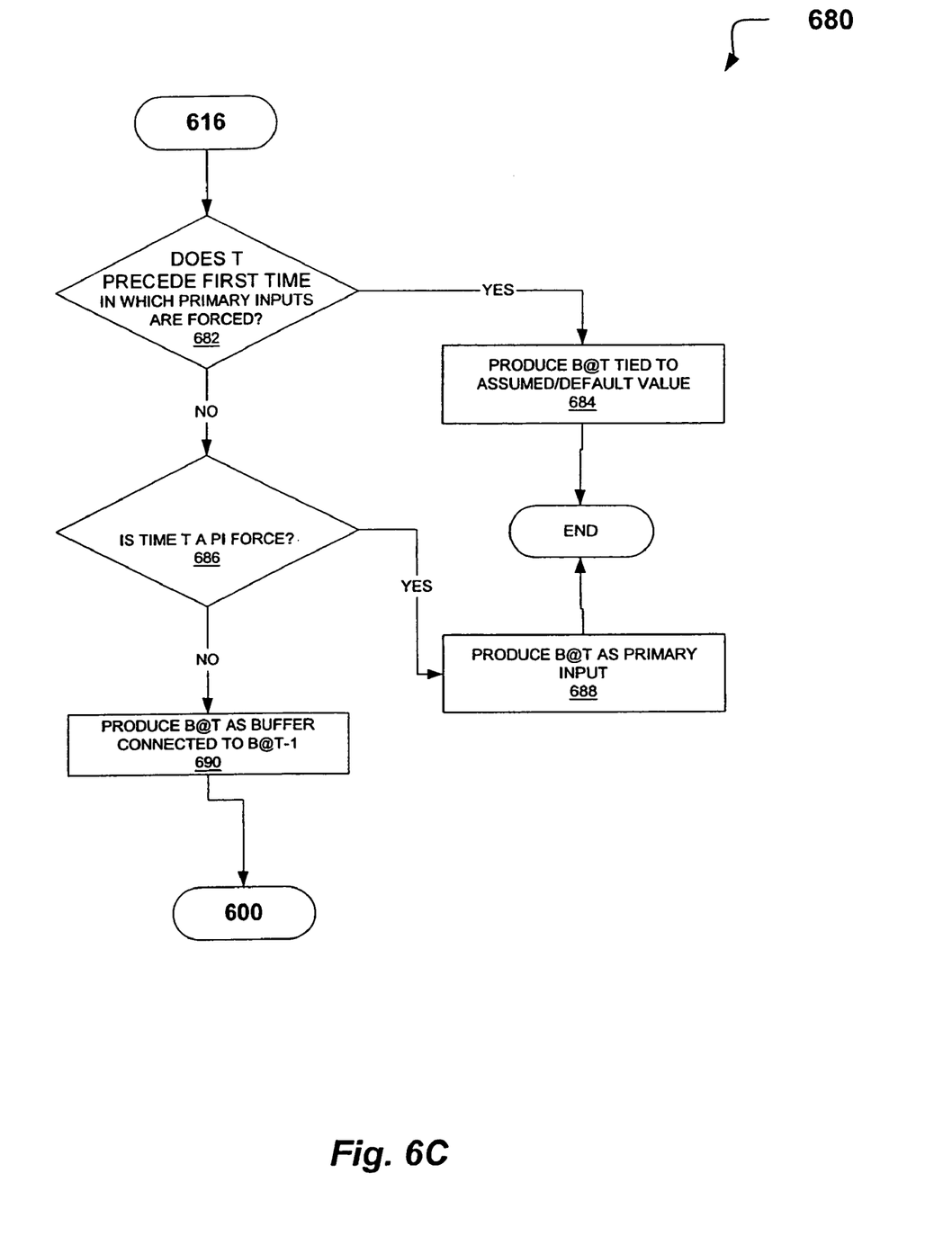
FIG. 6C illustrates an exemplary flow diagram of a method 680 invoked by the stage 616 of FIG. 6A in accordance with an embodiment of the present invention.

FIG. 6C illustrates an exemplary flow diagram of a method 680 invoked by the stage 616 of FIG. 6A in accordance with an embodiment of the present invention. The method 680 starts with a stage 682, which determines whether time T precedes the first time in which the primary inputs are forced. If so, a stage 684 produces B@T tied to an assumed, default value, for example, the same value as is assumed to be on this input at the start of a test (generally, high-Z for tester contacted, bi-directional pins, logicX for non-contacted pins, etc.). Thereafter, the method 680 terminates. If the stage 682 returns a "no," a stage 686 determines whether time T is a PI force. If so, a stage 688 produces B@T as a primary input and the method 680 terminates thereafter. Otherwise, a stage 690 produces B@T as a buffer (e.g., for tri-state or bi-directional inputs, a buffer capable of passing high-Z is used). The buffer may be connected to B@T−1. The method 680 continues by invoking the method 600 with block B and time T−1.

In accordance with an embodiment of the present invention, the following pseudo code segments may be utilized to perform one or more of the methods discussed with respect to FIGS. 6A–C. For example, pseudo code "backtrace" relates to the method 600, "handleLatch" relates to the method 640, and "handlePI" relates to the method 680.

```
backTrace(block B at time T)
{
    if(time T < 0)
    {
        produce "B@T" as a block tied to logic X - no values are known before the
        start of the clocking sequence
        return; /* block has been processed, skip remaining rules */
    }
    if(block B has a known simulation value at time T)
    {
        produce a tied block "B@T" with the same, known value (0, 1, or Z)
        return; /* block has been processed, skip remaining rules */
    }
    if(block B is a combinational block (AND, OR, etc))
    {
        produce block "B@T" with the same function as block B
        for(each input I of block B)
        {
            backTrace(I,T)
            return; /* block has been processed, skip remaining rules */
        }
    }
    if(block B is a latch)
    {
        handleLatch(B,T)
        return; /* block has been processed, skip remaining rules */
    }
    if(block B is a primary input)
    {
        handlePI(B,T)
        return; /* block has been processed, skip remaining rules */
    }
}
handleLatch(block B at time T)
{
    if(time T is a scan load and block B is a scannable latch)
    {
        produce "B@T" as a primary input
        return; /* block has been processed, skip remaining rules */
    }
    if(time T is a scan load and block B is affected by the scan load)
    {
        produce "B@T" as a tied block - tied to 0, 1 or X depending on the
        effect of the scan load on block B
        return; /* block has been processed, skip remaining rules */
    }
    { /* general latch processing */
        examine each of the clock inputs of block B using the simulation values
        from time T - count the number of clock inputs definitely on, definitely
        off and the number of clock inputs at an unknown value.
        if(all clocks are definitely off)
        {
            produce "B@T" as a buffer connected to "B@T-1"
            backTrace(B,T-1)
            return; /* block has been processed, skip remaining rules */
        }
        if(exactly one clock is definitely on, all others definitely off)
        {
            let D be the data input of the port whose clock is on
            produce "B@T" as a buffer connected to D@T
```

```
          backTrace(D,T)
          return; /* block has been processed, skip remaining rules */
          }
       produce a mux model for "B@T" the mux will have one port for each
       clock input to B that was not definitely off at time T plus an
       additional port for the latch's prior state
       for(each port P of latch B whose clock input C is not definitely off)
          {
          let D be the data input for port P
          connect D@T and C@T to the next available port of the mux
             (as data and select, respectively)
          backTrace(D,T)
          backTrace(C,T)
          }
       create a NOR block combining all of the clock inputs to block B at time T
       that were not definitely off and connect this NOR to the last select input
       of the mux
       connect "B@T-1" to the last data input of the mux
       backTrace(B,T-1)
       } /* general latch processing */
   }
handlePI(block B at time T)
{
   if(time T precedes the first time in which the primary inputs are forced)
      {
      produce "B@T" as a tied block with the same value as is assumed to be on this input at the start of a test
         (usually high-Z for tester contacted, bi-directional pins, logicX for non-contacted pins, etc)
      return /* block has been processed, skip remaining rules */
      }
   if(time T is a PI force)
      {
      produce "B@T" as a primary input
      return /* block has been processed, skip remaining rules */
      }
```

It is envisioned that the methods discussed above (e.g., 600, 640, and/or 680) and/or the pseudo codes may be performed by a general-purpose computer system. The computer system may include a central processor, a main memory, an input/output (I/O) controller, a keyboard, a pointing device (e.g., mouse, track ball, pen device, or the like), a display device, a mass storage device (e.g., a nonvolatile storage such as a hard disk, an optical drive, and the like), and a network interface. Additional input/output devices, such as a printing device, may be included in the computer system as desired. The various components of the computer system may communicate through a system bus or similar architecture.

Moreover, instead of a single processor, two or more processors (whether on a single chip or on separate chips) can be utilized to provide speedup in operations. It is further envisioned that the processor may be a complex instruction set computer (CISC) microprocessor, a reduced instruction set computing (RISC) microprocessor, a very long instruction word (VLIW) microprocessor, a processor implementing a combination of instruction sets, and the like.

Select embodiments of the present invention may include various operations, which are described herein. The operations of the embodiments of the present invention may be performed by hardware components or may be embodied in machine-executable instructions, which may be in turn utilized to cause a general-purpose or special-purpose processor, or logic circuits programmed with the instructions to perform the operations. Alternatively, the operations may be performed by a combination of hardware and software.

Moreover, embodiments of the present invention may be provided as computer program products, which may include machine-readable medium having stored thereon instructions used to program a computer (or other electronic devices) to perform a process according to embodiments of the present invention. The machine-readable medium may include, but is not limited to, floppy diskettes, optical disks, compact disc-read only memories (CD-ROMs), and magneto-optical disks, read-only memories (ROMs), random-access memories (RAMs), erasable programmable ROMs (EPROMs), electrically EPROMs (EEPROMs), magnetic or optical cards, flash memory, or other types of media or machine-readable medium suitable for storing electronic instructions and/or data.

Additionally, embodiments of the present invention may be downloaded as a computer program product, wherein the program may be transferred from a remote computer (e.g., a server) to a requesting computer (e.g., a client) by way of data signals embodied in a carrier wave or other propagation medium via a communication link (e.g., a modem or network connection). Accordingly, herein, a carrier wave shall be regarded as comprising a machine-readable medium.

Accordingly, in one embodiment of the present invention, a method of transforming a sequential logic design into combinational logic begins by simulating each step of the clocking sequence. The simulation values from each step of the clock sequence are saved for subsequent use by the method. Moreover, scan operations may be simulated by placing the design in its scan state. Any scan pre-conditioning may be simulated, any scan control inputs may be set to their scan-enable values, and all clocks are turned off in such an embodiment of the present invention. As a result, an accurate simulation of the side effects of the scan operation (e.g., on the design's primary inputs, non-scannable latches, etc) may be created.

Furthermore, PI force events may be simulated by turning off all of the clock inputs to the design. This is a reflection of the ground rule that all clocks should be off whenever the tester drives (potentially new) values into the design's primary inputs. Additionally, clock pulse events may be simulated by turning off all clocks except the clock being pulsed. This is due to the ground rule that only one clock at a time may be on. The clock being pulsed is left on. And, a measured primary output event may inherit the simulation values from the immediately prior time. No actual simulation needs to be performed. Measurement of the scannable latches may be handled as a scan operation. Once the simulations are performed, the method may perform a series of backward logic traces. For each time "T" of the clocking sequence, each block ("B") being measured at this time (i.e., measure primary output and scan unload events) is traced as in "backTrace(B,T)".

Figure 7A:
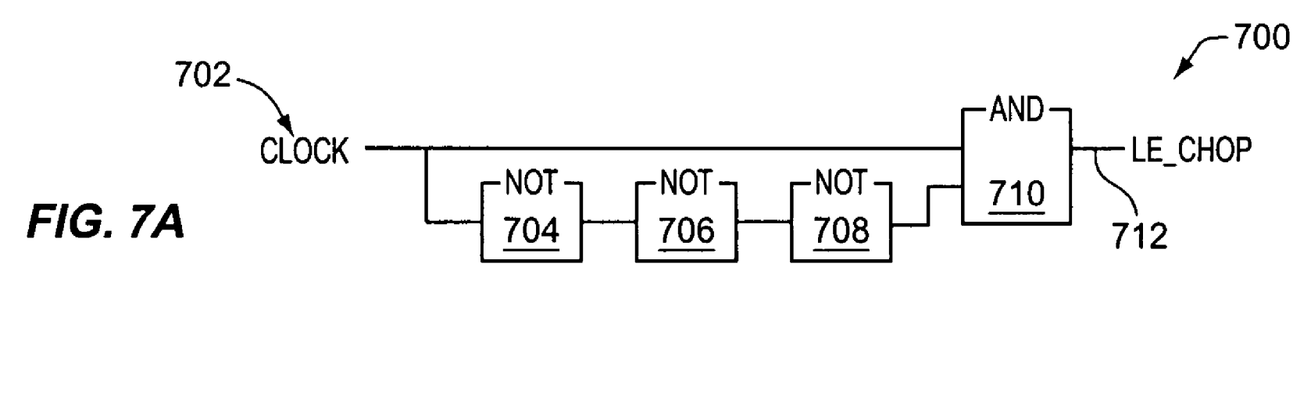
FIG. 7A illustrates an exemplary leading edge clock chopper 700 which may be utilized in conjunction with select embodiments of the present invention.
Figure 7B:
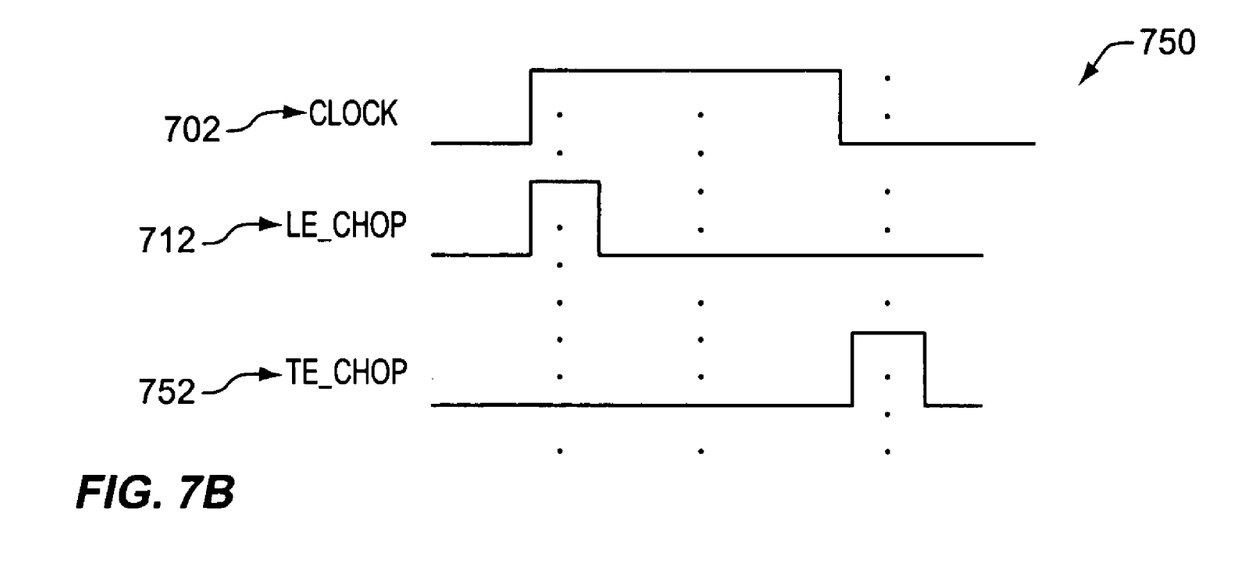
FIG. 7B illustrates exemplary waveforms 750 produced by both a leading edge and trailing edge clock chopper which may be utilized in conjunction with select embodiment of the present invention.

FIG. 7A illustrates an exemplary leading edge clock chopper 700 which may be utilized in conjunction with select embodiments of the present invention. FIG. 7B illustrates exemplary waveforms 750 produced by both a leading edge and trailing edge clock chopper which may be utilized in conjunction with select embodiment of the present invention. Generally, clock choppers are special circuits that take a clock pulse (e.g., from the design's primary inputs) and break it down into one or more smaller pulses (or clock slivers).

As illustrated the clock chopper 700 receives a clock signal (702) and provides it both directly and indirectly (e.g., through NOT gates 704–708) to an AND gate 710. The output of the AND gate 710 is the output of the clock chopper 700 (712). With respect to FIG. 7B, the waveforms associated with the clock signal 702, the leading edge clock chopper output signal 712, and a trailing edge clock chopper output signal 752 are illustrated. The dotted lines of FIG. 7B denote three distinct simulation states produced by the choppers. In the simulation phase of the method (such as those discussed with respect to FIGS. 6A–C and/or the pseudo codes above) if each of these states is captured as a separate time, then the method may proceed as described previously and all of the clock chopping behavior(s) would be accurately reflected in the resulting combinational logic.

In the general case, it is envisioned that there may be any number of leading and/or trailing edge clock choppers. It is also possible for a chopped clock to feed another clock chopper (presumed to produce an even narrower clock pulse). During the simulation of the clocking sequence, each distinct state (or step in the progression of chopped clocks) may be saved as a separate time frame.

Accordingly, the applicability of the techniques discussed herein for transforming sequential logic designs to equivalent combinational logic is envisioned to readily deal with clock choppers present in a sequential design. Generally, adding clock choppers to sequential logic makes the test generation problem harder to solve (partly because of the slivers of pulses involved). In one embodiment of the present invention, rather than taking latches out and connecting the logic front to back, an accurate model with separate time frames for slivers of the clocks may be created.

In an embodiment of the present invention, a method is described wherein a sequential logic design and a clocking sequence can be transformed into equivalent combinational logic. This combinational logic may be used for ATPG. Test patterns produced using the combinational logic may be mapped back to the original, sequential design. This allows combinational ATPG algorithms to be used effectively on sequential logic designs, affording a significant reduction in ATPG problem difficulty. Use of this method may provide significant advantages over traditional, sequential ATPG methods, for example, in terms of fault coverage and pattern compaction for some real world logic designs.

In one embodiment of the present invention, the method is well suited for processing designs with complex, sequential logic. It effectively handles designs with complex clock gating logic, poorly controlled clocks, and clock race conditions. This method is also well suited for processing designs to be tested with arbitrary clocking sequences. At-speed (and near-speed) testing often relies on special, on product circuitry to produce an arbitrary series of clock pulses for the rest of the design. This method may in one embodiment of the present invention impose a specific clocking sequence on the design, providing an effective solution to the problems posed by test generation using an arbitrary clocking sequence.

In an embodiment of the present invention, the method also provides a simple approach to partition the design to be tested into a number of smaller pieces for easier processing. The smaller pieces may be handled on separate computing devices, for example, by applying parallel processing techniques to speed up the design process. For example, in one embodiment of the present invention, the method creates combinational equivalent logic by back tracing from selected observe points (e.g., design primary outputs or scannable latches). If a selected subset of the observe points are processed, only the logic feeding these observe points is produced in an embodiment of the present invention. This allows the design to be partitioned or broken down into several, smaller pieces for easier and/or faster processing.

In one embodiment of the present invention, the method replaces a latch with a MUX. The clock inputs to the latch act as select inputs to the MUX—when a particular clock is on, the corresponding data input is selected. When no clocks are on, the latch's prior state is selected. This allows a combinational model to accurately reflect the (potentially complex) clocking behavior found in many sequential designs.

The foregoing description has been directed to specific embodiments. It will be apparent to those with ordinary skill in the art that modifications may be made to the described embodiments, with the attainment of all or some of the advantages. For example, the schemes, data structures, and methods described herein can also be extended to other applications. Also, even though AND/OR and tri-state implementations of the MUXes are discussed herein, it is envisioned that many other implementations are possible.

Furthermore, although an embodiment is disclosed which uses a simple buffer to model a latch when that latch has one clock input on, it is also envisioned that a MUX representation may be utilized. This is envisioned to produce a slightly larger combinational circuit but the "extra" logic may allow clock stuck-off faults to be targeted explicitly for these latches. Therefore, it is the object of the appended claims to cover all such variations and modifications as come within the spirit and scope of the invention.

What is claimed is:

1. A method for integrated circuit designs, the method comprising:
    simulating each stage of a clocking sequence on a sequential logic design to produce simulation values, wherein the clocking sequence is an ordered series of steps including scan operations, primary input force events, clock pulses, and measure events;
    saving the simulation values; and
    performing a plurality of backward logic traces on the sequential logic design based on the saved simulation values to provide an equivalent combinational logic representation of the sequential logic design.

2. The method of claim 1 wherein
for each time "T" of the clocking sequence, each block being measured at the time T is traced.

3. The method of claim 2 wherein
for each block being measured, one or more items selected from a list comprising measure primary output and scan unload event are traced.

4. The method of claim 1 further including:
simulating scan operations by placing the sequential logic design in its scan state.

5. The method of claim 1 further including:
turning off all other clocks when a given clock is pulsed.

6. The method of claim 1 further including:
simulating primary input force events by turning off all of the clock inputs to the sequential logic design.

7. The method of claim 1 wherein
the equivalent combinational logic representation facilitates automatic test pattern generation, and
the method further includes
mapping test patterns back to the sequential logic design.

8. The method of claim 1 farther including:
partitioning the sequential logic design to be tested into a plurality of smaller pieces.

9. The method of claim 8 wherein
the plurality of smaller pieces are processed on separate computing devices.

10. The method of claim 1 wherein
the sequential logic design includes one or more chopped clocks.

11. The method of claim 10 wherein
the simulation of each stage of the clocking sequence includes saving distinct states in response to the one or more chopped clocks.

12. A method for integrated circuit designs, the method comprising:
simulating each stage of a clocking sequence on a sequential logic design to produce simulation values, including simulating a scan operation on the sequential logic design, wherein the clocking sequence is an ordered series of steps including scan operations, primary input force events, clock pulses, and measure events;
saving the simulation values; and
performing a plurality of backward logic traces on the sequential logic design based on the saved simulation values to provide an equivalent combinational logic representation of the sequential logic design.

13. The method of claim 12 farther including:
setting scan control inputs to their scan-enable values.

14. The method of claim 12 farther including:
turning off all clocks for the simulating of the scan operation.

15. A method comprising:
simulating each stage of a clocking sequence to produce simulation values, wherein the clocking sequence is an ordered series of steps including scan operations, primary input force events, clock pulses, and measure events;
saving the simulation values; and
performing a plurality of backward logic traces based on the saved simulation values to provide an equivalent combinational logic representation of a sequential logic design, including
determining whether a time T is negative;
if it is determined that the time T is negative, producing a block B at time T as a block tied to an unknown logic;
if it is determined that the time T is not negative, determining whether the block B has a known simulation value at time T; and
if it is determined that the block B has a known simulation value at time T, producing a tied block B at time T with the known simulation value.

16. The method of claim 15 wherein
the known simulation value is selected from a group consisting of 0, 1 and Z.

17. The method of claim 15 further including:
if it is determined that the block B has no known simulation value at time T, determining whether the block B is a combinational block;
if the block B is a combinational block, producing block B at time T with the same function as block B; and
for each input I of the block B, back tracing the design.

18. The method of claim 17 wherein
the combinational block is selected from a group comprising an AND gate and an OR gate.

19. The method of claim 15 further including:
if it is determined that the block B has no known simulation value at time T, determining whether the block B is a latch; and
if it is determined that the block B is a latch, processing the block B as a latch.

20. The method of claim 15 further including:
if it is determined that the block B has no known simulation value at time T, determining whether the block B is a primary input; and
if it is determined that the block B is a primary input, processing the block B as a primary input.

21. An article of manufacture for integrated circuit design comprising:
a machine readable medium that provides instructions that, if executed by a machine, will cause the machine to perform operations including:
simulating each stage of a clocking sequence on a sequential logic design to produce simulation values, wherein the clocking sequence is an ordered series of steps including scan operations, primary input force events, clock pulses, and measure events;
saving the simulation values; and
performing a plurality of backward logic traces on the sequential logic design based on the saved simulation values to provide an equivalent combinational logic representation of the sequential logic design.

22. The article of claim 21 wherein
for each time "T" of the clocking sequence, each block being measured at the time T is traced.

23. The article of claim 22 wherein
for each block being measured, one or more items selected from a list comprising measure primary output and scan unload event are traced.

24. The article of claim 21 wherein
the operations further include simulating scan operations by placing the sequential logic design in its scan state.

25. The article of claim 21 wherein
the operations further include simulating primary input force events by turning off all of the clock inputs to the design.

26. The article of claim 21 wherein
the operations are used for automatic test pattern generation.

27. The article of claim 21 wherein
the operations further include partitioning the sequential logic design to be tested into a plurality of smaller pieces.

28. The article of claim 27 wherein
the plurality of smaller pieces are processed on separate computing devices.

29. The article of claim 21 wherein
the sequential logic design includes one or more chopped clocks.

30. The article of claim 21 wherein
the simulation of the clocking sequence includes saving distinct states in response to the one or more chopped clocks.

31. An article of manufacture for integrated circuit design comprising:
a machine readable medium that provides instructions that, if executed by a machine, will cause the machine to perform operations including:
  simulating each stage of a clocking sequence to produce simulation values, wherein the clocking sequence is an ordered series of steps including scan operations, primary input force events, clock pulses, and measure events;
  saving the simulation values; and
  performing a plurality of backward logic traces based on the saved simulation values to provide an equivalent combinational logic representation of a sequential logic design including the operations of
    determining whether a time T is negative;
    if it is determined that the time T is negative, producing a block B at time T as a block tied to an unknown logic;
    if it is determined that the time T is not negative, determining whether the block B has a known simulation value at time T; and
    if it is determined that the block B has a known simulation value at time T, producing a tied block B at time T with the known simulation value.

32. The article of claim 31 wherein
the operations further include:
  if it is determined that the block B has no known simulation value at time T, determining whether the block B is a combinational block;
  if the block B is a combinational block, producing block B at time T with the same function as block B; and
  for each input I of the block B, back tracing the design.

33. The article of claim 31 wherein
the operations further include:
  if it is determined that the block B has no known simulation value at time T, determining whether the block B is a latch; and
  if it is determined that the block B is a latch, processing the block B as a latch.

34. The article of claim 31 wherein
the operations further include:
  if it is determined that the block B has no known simulation value at time T, determining whether the block B is a primary input; and
  if it is determined that the block B is a primary input, processing the block B as a primary input.

* * * * *